United States Patent
Moore (10) Patent No.: US 11,251,317 B2
(45) Date of Patent: Feb. 15, 2022

(54) PHOTODIODE INCLUDING AN ADDITIONAL DEPLETION REGION FOR SENSITIVITY CONTROL AND METHOD OF CREATING THE SAME

(71) Applicant: STMICROELECTRONICS (RESEARCH & DEVELOPMENT) LIMITED, Marlow (GB)

(72) Inventor: John Kevin Moore, Edinburgh (GB)

(73) Assignee: STMICROELECTRONICS (RESEARCH & DEVELOPMENT) LIMITED, Marlow (GB)

( * ) Notice: Subject to any disclaimer, the term of this patent is extended or adjusted under 35 U.S.C. 154(b) by 0 days.

(21) Appl. No.: 16/841,412

(22) Filed: Apr. 6, 2020

(65) Prior Publication Data

US 2020/0328314 A1    Oct. 15, 2020

(30) Foreign Application Priority Data

Apr. 10, 2019 (EP) .................................. 19168451

(51) Int. Cl.
- *H01L 31/02* (2006.01)
- *G01J 1/44* (2006.01)
- *H01L 31/107* (2006.01)

(52) U.S. Cl.
CPC .......... *H01L 31/02027* (2013.01); *G01J 1/44* (2013.01); *H01L 31/107* (2013.01); *G01J 2001/4466* (2013.01)

(58) Field of Classification Search
CPC ............. H01L 29/868; H01L 31/02005; H01L 31/02027; H01L 31/03529; H01L 31/107; G01J 1/44; G01J 2001/4466

USPC .................................. 250/214 R, 214.1, 239
See application file for complete search history.

(56) References Cited

U.S. PATENT DOCUMENTS 9,178,100 B2 * 11/2015 Webster .............. H01L 31/1804
2002/0024058 A1    2/2002 Marshall et al.

OTHER PUBLICATIONS

Cui et al., "A Charge Compensation Phototransistor for High-Dynamic-Range CMOS Image Sensors," *IEEE Transactions on Electron Devices* 65(7):2932-2938, 2018.

(Continued)

*Primary Examiner* — Que Tan Le
(74) *Attorney, Agent, or Firm* — Seed IP Law Group LLP (57) ABSTRACT

The present disclosure is directed to a diode including a first doped structure, doped with a first type of material and forming at least part of an isolation structure for the diode; at least one contact structure located within the first doped structure, the at least one contact structure forming one of the cathode or anode of the diode; a second doped structure, doped with a second type of material, and forming at least one depletion region or PN junction with the first doped structure; at least one second contact structure located within the second doped structure, the at least one second contact structure forming the other of the anode or the cathode of the diode; at least one further contact structure, doped with the first type of material, the at least one further contact structure forming at least one further depletion region or further PN junction, such that the at least one further depletion region is configured to steer charge from the at least one depletion region and thus decrease the sensitivity of the diode.

20 Claims, 6 Drawing Sheets

(56) References Cited

OTHER PUBLICATIONS

Jo et al., "Wide Dynamic Range CMOS Active Pixel Sensor Using a Stacked-Photodiode Structure," *IEEE International Instrumentation and Measurement Technology Conference Proceedings*, May 13-16, Graz, Austria, 2012, 4 pages.

* cited by examiner

PHOTODIODE INCLUDING AN ADDITIONAL DEPLETION REGION FOR SENSITIVITY CONTROL AND METHOD OF CREATING THE SAME

BACKGROUND

Technical Field

The present disclosure relates to a photodiode (in particular an avalanche photodiode, for example a single photon avalanche diode) with sensitivity control using a further depletion region and a method of manufacturing a photodiode.

Description of the Related Art

A photodiode is a PN semiconductor device capable of detecting light. A photon impinging on a detection region (such as within the depletion region of the PN junction) generate an electron and hole pair via the photoelectric effect. The PN junction is reverse-biased with a voltage magnitude such that when the electron/hole carriers are generated, the electric field applied across the detection region causes the carriers to be accelerated to the anode and cathode of the diode which generates a current. The current generated by the diode is proportional to the number of photons generating the electron-hole pairs.

An avalanche diode and specifically a single photon avalanche diode (SPAD) is a photodiode with a PN junction which is reverse biased at a voltage exceeding a breakdown voltage. A carrier generated by a single photon is accelerated to a relatively high velocity according to the strength and direction of the applied electric field. If the kinetic energy of the accelerated carriers is sufficient, additional carriers will be generated from the semiconductor lattice, which are in turn accelerated by the field, and may liberate further carriers in an exponentially increasing fashion. Thus, when a sufficiently high electric field is applied across the detection region (created by the voltage exceeding the breakdown voltage), a single impinging photon may generate an avalanche of carriers, resulting in an output current 'pulse', where the current output is proportional to the number of photons detected. The SPAD may be quenched allowing the PN junction to be reset to detect further photons.

BRIEF SUMMARY

According to one embodiment, there is provided a diode, comprising: a first doped structure, doped with a first type of material and forming at least part of an isolation structure for the diode; at least one contact structure located within the first doped structure, the at least one contact structure forming one of the cathode or anode of the diode; a second doped structure, doped with a second type of material, and forming at least one depletion region or PN junction with the first doped structure; at least one second contact structure located within the second doped structure, the at least one second contact structure forming the other of the anode or the cathode of the diode; at least one further contact structure, doped with the first type of material, the at least one further contact structure forming at least one further depletion region or further PN junction, such that the at least one further depletion region is configured to steer charge from the at least one depletion region and thus decrease the sensitivity of the diode.

The first doped structure may comprise: a first type of material doped well forming a peripheral well of the diode; and a first type of material doped isolation structure, wherein the first type of material doped well forming a peripheral well of the diode and the first type of material doped isolation structure may at least partially overlap and may form the isolation structure for the diode.

The first type of material doped isolation structure and the second doped structure may form a first depletion region configured to enable the diode to operate as at least one of: an avalanche diode; and a single photon avalanche diode.

The at least one further contact structure may be located physically between the at least one contact structure and the at least one second contact structure depletion region contact structure.

The at least one second contact structure depletion region contact structure may be located physically between the at least one contact structure and the at least one further contact structure.

The at least one contact structure may be coupled to a first voltage, the first voltage such that the at least one depletion region or PN junction may be reverse biased above a breakdown voltage such that the diode may be configured to operate as an avalanche diode, wherein the at least one second contact structure located within the first doped structure may be coupled to a first avalanche diode readout output.

The at least one further contact structure may be selectively coupled to a regulated voltage, such that the at least one further depletion region or PN junction may be reverse biased below the breakdown voltage.

The at least one further contact structure may be selectively coupled to a photodiode readout output.

The first type of material may be an n-type dopant and the second type of material may be a p-type dopant.

According to one embodiment, there is provided a method for operating a diode, the method comprising: forming at least part of an isolation structure for the diode with a first doped structure, doped with a first type of material; forming one of a cathode or anode of the diode with at least one contact structure located within the first doped structure; forming at least one depletion region or PN junction with the first doped structure with a second doped structure, doped with a second type of material; forming the other of the anode or the cathode of the diode using at least one second contact structure located within the second doped structure; and forming at least one further depletion region or further PN junction between at least one further contact structure doped with the first type of material and the second doped structure, such that the at least one further depletion region is configured to steer charge from the at least one depletion region and thus decrease the sensitivity of the diode.

Forming at least part of an isolation structure for the diode with a first doped structure, doped with a first type of material may further comprise: forming a peripheral doped well of the diode with the first type of material; and forming a doped isolation structure with the first type of material, wherein the peripheral well of the diode and the doped isolation structure at least partially overlap and form the isolation structure for the diode.

The doped isolation structure and the second doped structure may form a first depletion region operating as at least one of: an avalanche diode; and a single photon avalanche diode.

The method may comprise locating the at least one further contact structure physically between the at least one contact structure and the at least one second contact structure depletion region contact structure.

The method may comprise locating the at least one second contact structure depletion region contact structure between the at least one contact structure and the at least one further contact structure.

The method may further comprise: coupling the at least one contact structure to a first voltage in order to reverse bias the at least one depletion region or PN junction above a breakdown voltage such that the diode is configured to operate as an avalanche diode; and coupling the at least one second contact structure located within the first doped structure to a first avalanche diode readout output.

The method may further comprise selectively coupling the at least one further contact structure to a regulated voltage, such that the at least one further depletion region or PN junction may be reverse biased below the breakdown voltage.

The method may further comprise selectively coupling the at least one further contact structure to a photodiode readout output.

The first type of material may be an n-type dopant and the second type of material may be a p-type dopant.

BRIEF DESCRIPTION OF THE SEVERAL VIEWS OF THE DRAWINGS

Reference will now be made, by way of example, to the accompanying drawings in which.

DETAILED DESCRIPTION

A diode is an electrical device allowing current to move through it in one direction with far greater ease than in the other. The most common kind of diode in modern circuit design is the semiconductor diode and is based on a PN junction.

A PN junction includes a P region (i.e., region doped with a P dopant) and an N region (i.e., region doped with an N dopant type). The N region contains electrons in excess while the P region contains holes in excess. When the PN junction is formed holes are naturally diffused from the P region to the N region and recombined with electrons. Likewise, electrons are naturally diffused from the N region to the P region and are recombined with holes. In this way, a depletion region with pairs of recombined holes and electrons is formed at the interface (i.e., the junction) of the P region and the N region.

The diffusion of holes from the P region leaves negative acceptor ions in the P region. While the diffusion of electrons from the N region leaves positive donor ions in the N region. This creates a depletion region electric field that provides a force opposing the continued diffusion of holes and electrons. When the depletion region electric field is sufficiently high the diffusion of holes and electrons is interrupted and the depletion region reaches an equilibrium.

The width of the depletion region depends on the concentration of holes in the P region, the concentration of electrons in the N region and a voltage supply applied to the PN junction.

When the voltage supply is a forward bias voltage supply, the P region is electrically connected with a positive terminal of the voltage supply and the N region is electrically connected with a negative terminal of the voltage supply. In this way, the holes in the P region and the electrons in the N region are pushed toward the interface of the P region and the N region. The width of the depletion region decreases.

When the voltage supply is a reverse bias voltage supply, the P region is electrically connected with a negative terminal of the voltage supply and the N region is electrically connected with a positive terminal of the voltage supply. In this way, the holes in the P region and the electrons in the N region are pushed away from the interface of the P region and the N region. The width of the depletion region increases.

The width of the depletion region increases with the increase in reverse bias voltage supply up to a voltage. If the reverse bias voltage supply is increased beyond that voltage, the junction breaks down and allows a reverse current. At this point, a small increase in the voltage will rapidly increase the reverse current. The voltage at which the PN junction breaks down occurs is known as the "breakdown voltage".

The depletion region breakdown may be caused by two mechanisms: zener breakdown and avalanche breakdown.

In avalanche breakdown, when the reverse voltage supply exceeds the breakdown voltage, electrons diffused in the depletion region are accelerated. The electrons collide with atoms and free bound electrons. Some of these electrons recombine with holes. Others are accelerated in the depletion region, collide with atoms and free further bound electrons, and so on. Likewise, holes diffused in the depletion region area are accelerated in the opposite direction and initiate a similar process. In this way, a self-sustaining avalanche is created and the reverse current increases.

An avalanche diode, such as a single photon avalanche detectors (SPAD), follows the above principle. The PN junction is reverse biased at a voltage exceeding the breakdown voltage. When a photon with sufficient energy is absorbed, a bound electron is freed in the depletion region. The electron is accelerated, collide with atoms and frees further bound electrons. Some of these electrons recombine with holes. Others are accelerated, collide with atoms and free further bound electron, and so on.

Figure 1:
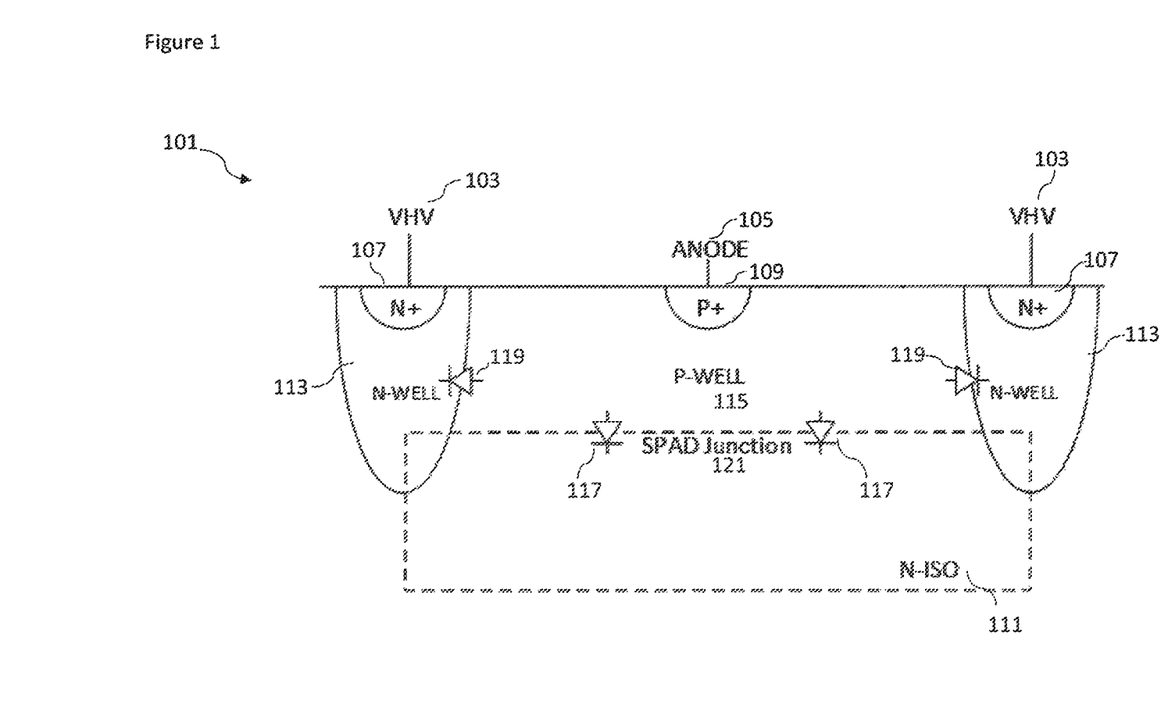
FIG. 1 is a schematic view of an example of a SPAD.

FIG. 1 shows a schematic view of an example avalanche diode 101, for example a single photon avalanche diode (SPAD). The avalanche diode 101 may typically be integrated in a system such as an imaging sensor. FIGS. 1 to 5 show a slice through example diode structures. In some embodiments the structure is rotationally symmetrical, in other words the diode structures are rings which form a cylindrical diode. However in some embodiments the diode structure may be any suitable shape, including square, rectangular or irregular. Furthermore in the examples shown in FIGS. 1 to 5 show a N doped isolation structure, however in some embodiments the diode is formed using a P doped isolation structure.

The avalanche diode 101 comprises a N− doped isolation region (N-Iso) 111 which forms the 'floor' of the diode (or is below the diode). The avalanche diode furthermore comprises an outermost N− doped ring (N-well) 113. The combination of the N-Iso and N-well complete an isolation region for the diode. Within the N− doped ring 113 is a N+ doped (N+) contact region 107 which forms the contact region for the cathode and which is configured to receive a high potential VHV 103. Within the region formed by the N-Iso 111 and N-well 113 is the P− doped well (P-well) region 115. Within the P-well 115 is the P+ doped contact region (P+) 109 which forms the contact region for the anode 105. In one embodiment, the N+ doped (N+) contact region 107, the P+ doped contact region (P+) 109, the N-Iso 111, the N− doped ring 113, and the P-well 115 are formed in a substrate, such as a semiconductor substrate.

The PN junction is represented by the diodes 117 between the P-well 115 and N-Iso 111 and the diodes between the P-well 115 and the N-well 113. The PN junction comprises a depletion region (also known as depletion layer or depletion zone) that is naturally formed at the interface (i.e., junction) of the P-well 115 and N-Iso 111 and the interface (i.e., junction) of the P-well 115 and N-well 113 as described above.

In very high light conditions (which may be caused by ambient light or returning light reflected from a target), SPADs can become saturated or experience pile-up. Saturation can be caused by the photons arriving too quickly after an avalanche event and before the SPAD has fully reset (the photon density causing the diode to operate as a photodiode) and thus causing an increased current consumption. Additionally a pile-up effect can be caused by photons arriving too quickly after an avalanche event and being missed (or a later output pulse effectively being masked by an earlier readout circuitry output pulse). This can have the effect of distortion of timing information output. Saturation and pile-up effects can be reduced by reducing the SPAD sensitivity in high light conditions.

It has been proposed to cover at least partially the SPAD with metal in order to reduce SPAD sensitivity (Photon Detection Probability). This metal cover reduces the amount of light which falls on the SPAD and is known as aperturing. Aperturing has the disadvantage of reducing the sensitivity in low light scenarios and furthermore is not flexible and cannot be adapted to adjust between low light and high light sensitivity.

A further known approach to reduce SPAD sensitivity is to modulate the voltage across a SPAD. Although providing the ability to alter the sensitivity, modulating the voltage across the SPAD has a very limited effect on SPAD photon detection probability (PDP) and as such typically used for a limited range of light levels.

The concept as discussed with respect to the examples and embodiments as shown herein in further detail is the implementation of additional contact regions within the diode. The additional contact regions are configured to generate additional depletion regions within the diode structure. The additional depletion regions are configured to steer charge out from the main well of the diode (which in the examples shown in FIGS. 2 to 5 is the P-well). The effect of steering charge out of the main or central well effectively reduces the number of carriers which may cause the avalanche at the SPAD junction.

Figure 2:
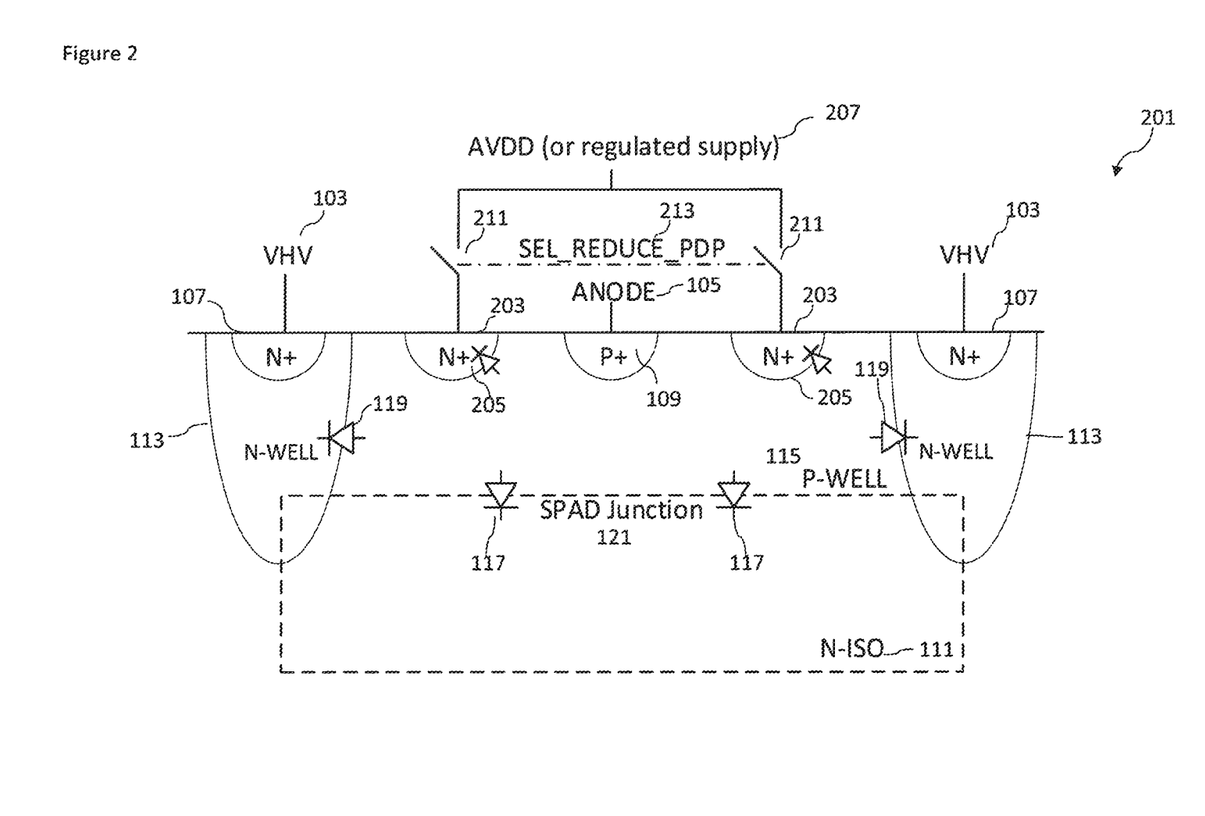
FIG. 2 is a schematic view of an example of a SPAD according to some embodiments.

For example FIG. 2 shows a schematic view of a first example avalanche diode 201.

The avalanche diode 201 comprises a similar N-doped arrangement such as shown in FIG. 1, the N doped isolation region (N-Iso) 111 which is below the diode, and a N doped ring (Nwell) 113 complete the isolation region for the diode. Within the N doped ring 113 is a N+ doped (N+) contact region 107 which forms the contact region for the cathode and which is configured to receive a high potential VHV 103. Within the isolation region surrounded by the N doped isolation region (N-Iso) 111 and N doped ring (Nwell) 113 is the P doped well (P-well) region 115. Within the P doped well region is the P+ doped region (P+) 109 which forms the contact region for the anode.

The PN junction is represented by the diodes 117 between the P-well 115 and N-Iso 111 and the diodes between the P-well 115 and the N-well 113. The PN junction comprises a depletion region (also known as depletion layer or depletion zone) that is naturally formed at the interface (i.e., junction) of the P-well 115 and the N-Iso 111 and N-well 113 as described above.

Additionally the diode comprises a N+ contact region (or ring) 203 which is located between the N+ contact 107 forming the cathode and the P+ contact 109 forming the anode. In one embodiment, the further N+ contact region 203 is formed in a substrate, such as a semiconductor substrate, along with the N+ doped (N+) contact region 107, the P+ doped contact region (P+) 109, the N-Iso 111, the N− doped ring 113, and the P-well 115. The additional or further N+ doped contact region 203 can be electrically coupled to a regulated supply voltage (for example AVDD) 207 via at least one switch 211. The at least one switch 211 can be controlled by a PDP reduce selection signal (SEL_REDUCE_PDP) 213 which is configured to selectively couple the N+ doped contact region to the regulated supply voltage. When the further N+ contact region 203 is electrically coupled to the regulated supply voltage 207 then the N+ contact region and the P-well interface generates additional depletion regions as shown by the diodes 205. As discussed above these additional depletion regions are configured to steer charge out from the main well (P-well) of the diode to the regulated supply voltage and thus reduce the sensitivity (PDP) of the diode as this reduces the number of carriers which cause avalanche at the SPAD junction.

In other words with the at least one switch 211 to the N+ region 203 closed, these terminals 203 are electrically connected to a high voltage>=V(SPADOFF) 207 and the further associated diodes 205 operate as photodiodes, removing charge from the P-well 215 and reducing SPAD sensitivity and therefore VHV load current.

With the at least one switch 211 to the N+ region 203 open, there is no electrical path from the regulated (high) voltage 207 to the SPAD and the SPAD operates as normal.

When electrically connected, the additional diodes operate in a similar manner to the reverse biased diodes from the P-well 115 to N-well 113 in reducing the performance of the SPAD.

Figure 3:
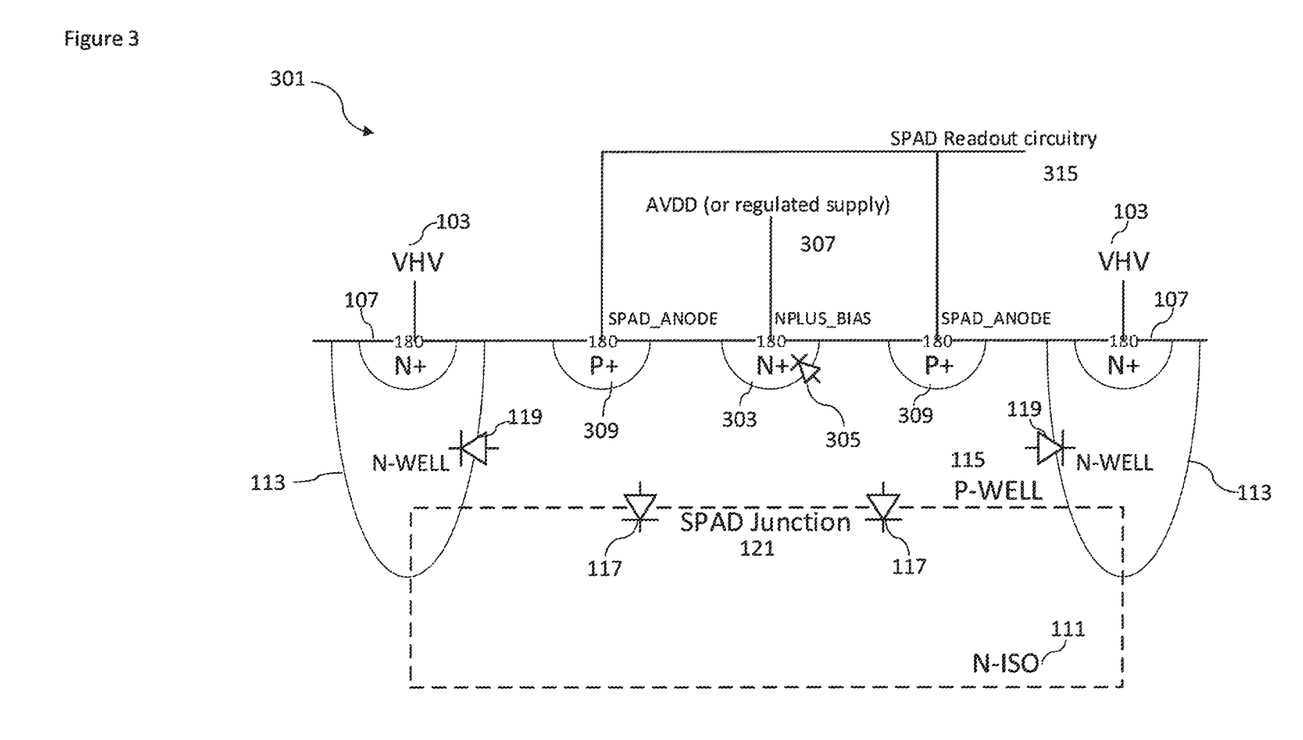
FIG. 3 is a schematic view of an example of a SPAD according to some embodiments.

With respect to FIG. 3 a further example is shown schematically of an avalanche diode 301.

The avalanche diode 301 comprises a similar doped arrangement such as shown in FIGS. 1 and 2. The N− doped isolation region (N-Iso) 111 is below the diode, and a N− doped ring (N-well) 113 completes the isolation region for the diode. The N-doped ring 113 connects to a N+ doped (N+) contact region or ring 107 which forms the contact region for the cathode and which is configured to receive a high potential VHV 103. Within the isolation region formed by the N− doped isolation region (N-Iso) 111 and N− doped ring (Nwell) 113 is the P− doped well (P-well) region 115.

Within the P− doped well region is a P+ doped region or ring (P+) 309 which forms the contact region for the anode and which is electrically connected to the SPAD readout circuitry 315. The P+ doped region or ring (P+) 309 which forms the contact region is a ring within the N− doped ring (Nwell) 113.

The PN junction is represented by the diodes 117 between the P-well 115 and N-Iso 111 (which form the SPAD junction 121) and the diodes between the P-well 115 and the N-well 113 (which operate as photodiodes). The PN junction comprises a depletion region (also known as depletion layer or depletion zone) that is naturally formed at the interface (i.e., junction) of the P-well 115 and the N-Iso 111 and N-well 113 as described above.

Additionally the diode comprises a 'further' N+ doped (N+) contact region 303 which is located within the rings of the P+ doped region or ring (P+) 309 and the N-doped ring (N-well) 113. The further N+ doped contact region 303 can be electrically coupled to a regulated supply voltage (for example AVDD) 307 (and may be electrically connected via at least one switch). The further N+ doped contact region 303 and the diode 305 can thus be selectively coupled to the regulated supply voltage and configured to steer charge out from the main well (P-well) of the diode to the regulated supply voltage and thus reduce the sensitivity (PDP) of the diode as this reduces the number of carriers which cause avalanche at the SPAD junction.

Figure 4:
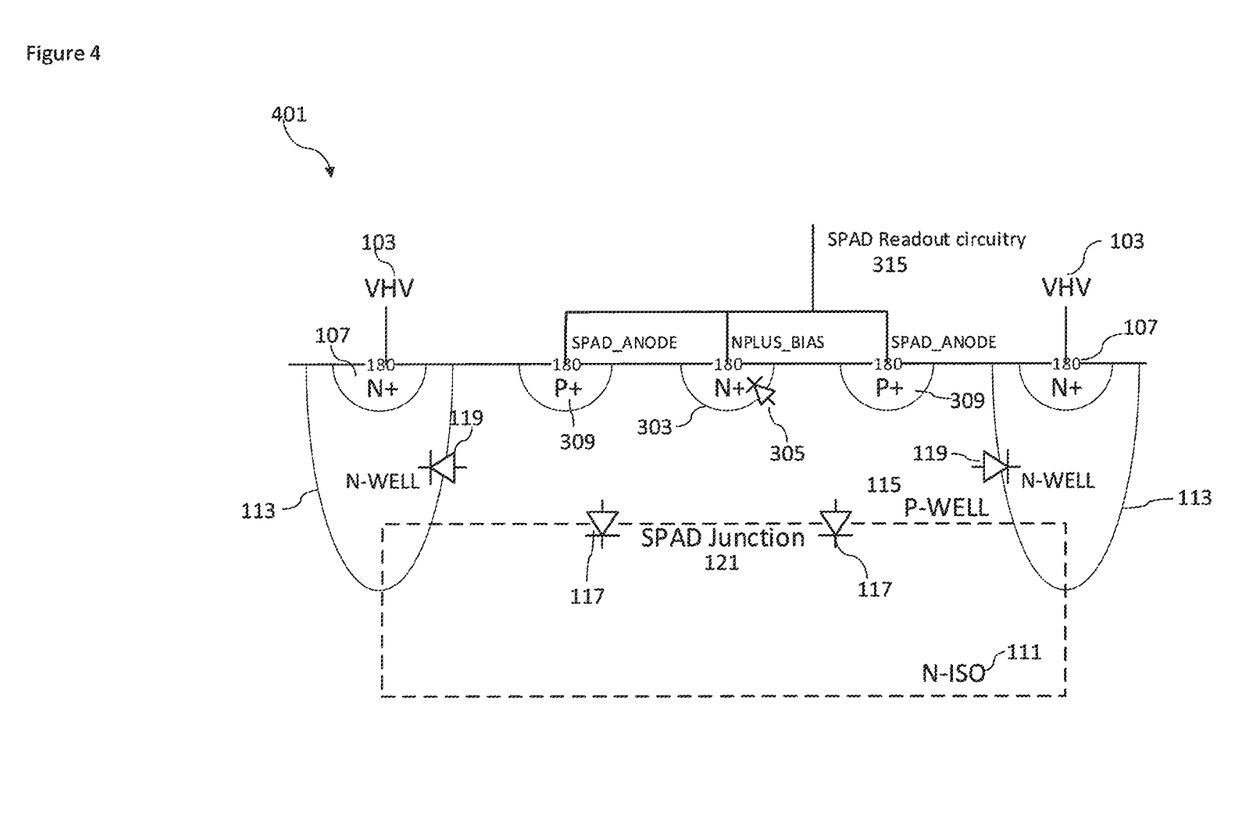
FIG. 4 is a schematic view of an example of a SPAD with a further connection arrangement according to some embodiments.

With respect to FIG. 4 a further example is shown schematically of an avalanche diode 401. The avalanche diode as shown in FIG. 4 differs from the diode 301 as shown in FIG. 3 in that the P+ doped contact region or ring (P+) 309, which forms the contact region for the anode, and the N+ doped (N+) contact region 303 are both coupled to the SPAD readout circuitry 315.

In other words FIG. 3 shows an example wherein the diode 301 is being operated in a low sensitivity mode and FIG. 4 shows the same example diode 401 where the diode 401 is being operated in a high sensitivity mode.

Figure 5:
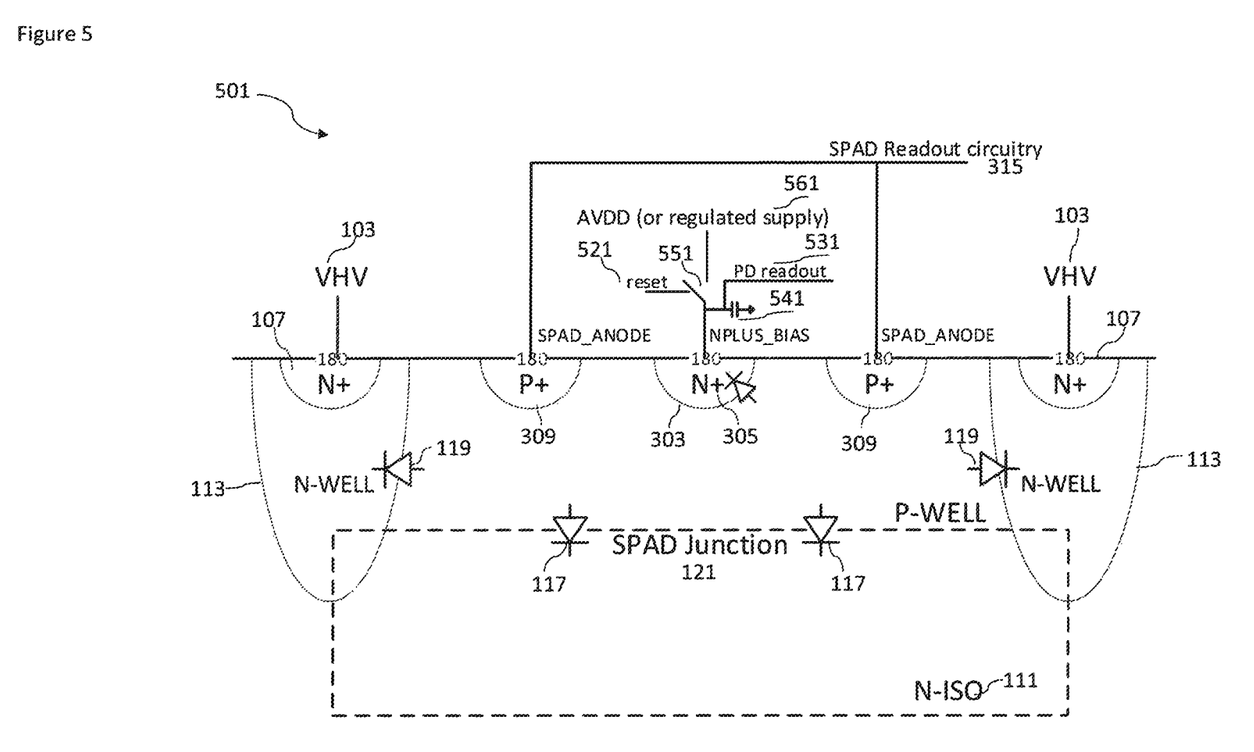
FIG. 5 is a schematic view of an example of a SPAD with a switched readout arrangement according to some embodiments.

With respect to FIG. 5 a further example is shown schematically of another avalanche diode 501.

The avalanche diode 501 comprises a similar doped arrangement such as shown in earlier FIGS. 3 and 4. The difference between this example and the examples shown in FIGS. 3 and 4 is the P+ doped region or ring (P+) 309 which forms the contact region for the anode and N-doped (N+) contact region 303. In this example the P+ doped region or ring (P+) 309 is coupled to the SPAD readout circuitry 515. The further N+ doped contact region 303 is coupled to a reference voltage (for example, ground or a voltage signal having a predetermine voltage level) via a capacitor 541 and to a photodiode (PD) readout 531. The further N+ doped contact region 303 can also be selectively coupled via at least one switch 551 to the regulated supply voltage 561 (for example AVDD). The control for the at least one switch 551 may be a reset signal 521. When the reset signal electrically couples the regulated supply voltage 561 to the further N+ doped contact region 305 via the switch 551 (e.g., closes the switch 551) then the further junction between the N+ doped contact region and the P-well steers the charge out from the main well of the diode to the regulated supply voltage and thus reduces the sensitivity (PDP) of the diode as this reduces the number of carriers which cause avalanche at the SPAD junction. When the reset signal does not electrically couple the regulated supply 561 to the further N+ doped contact region 303 via the switch 551 (e.g., opens the switch 551) then the junction between the further N+ doped contact region and the P-well junction operates as a photodiode and permits the outputting of a photodiode current out to the photodiode readout 531.

Figure 6:
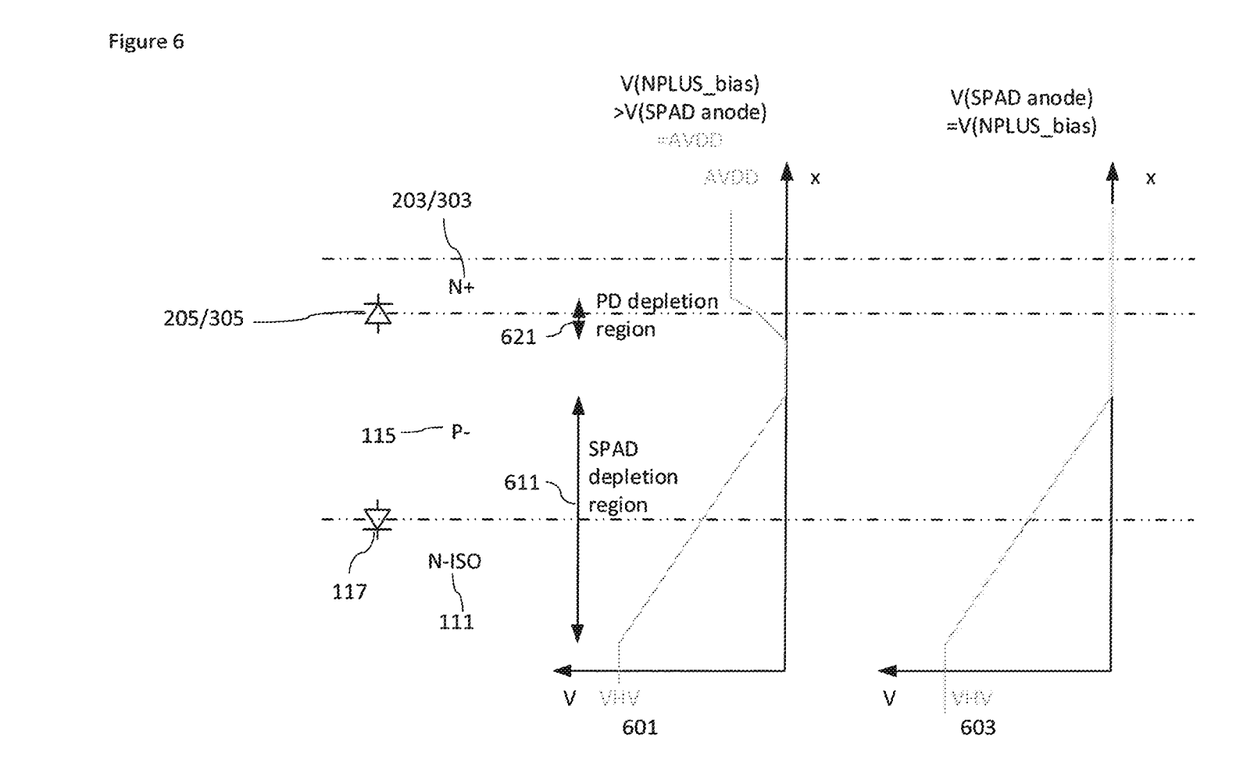
FIG. 6 is a schematic view of a potential fields through a slice of the example SPADs shown in FIGS. 2 to 5 according to some embodiments.

The potential effect of electrically coupling the further contacts to the regulated supply is shown in FIG. 6. The potential profile on the right 603 shows the example where the further contact regions where the voltage of the anode is the same of the further contact. In this example the potential is shown between the N-Iso 111 and P-well 115 junction forming the SPAD depletion region 611 as represented by diode 117.

The potential profile on the left 601 shows the example where the further contact regions where the voltage of the anode is less than the further contact. In this example the potential is shown between the N-Iso 111 and P-well 115 junction forming the SPAD depletion region 611 as represented by diode 117 and a potential between the P-well 115 and the further contact N+ 203/303 which forms the photodiode depletion region 621 as represented by diodes 205/305.

Although the examples are shown in this example as N doped isolation diodes it is understood that some embodiments may implement similar examples using P doped isolation diodes.

Various embodiments with different variations have been described here above. It should be noted that those skilled in the art may combine various elements of these various embodiments and variations. For example, areas of the N dopant type could be swapped for areas of the P dopant type and vice versa.

Such alterations, modifications, and improvements are intended to be part of this disclosure, and are intended to be within the scope of the claims. Accordingly, the foregoing description is by way of example and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A diode, comprising:
    a first doped structure having a first type of conductivity, the first doped structure forming at least part of an isolation structure for the diode;
    a first contact structure located in the first doped structure, the first contact structure having the first type of conductivity, the first contact structure forming one of a cathode or an anode of the diode;
    a second doped structure having a second type of conductivity, the second doped structure forming a first PN junction with the first doped structure;
    a second contact structure located in the second doped structure, the second contact structure having the second type of conductivity, the second contact structure forming the other of the cathode or the anode of the diode; and
    a third contact structure located in the second doped structure, the third contact structure having the first type of conductivity, the third contact structure forming a second PN junction with the second doped structure.

2. The diode of claim 1, wherein the first doped structure includes:
    a well having the first type of conductivity, the well forming a peripheral well of the diode, the isolation structure having the first type of conductivity, the well and the isolation structure at least partially overlapping with each other.

3. The diode of claim 2, wherein the isolation structure and the second doped structure form a depletion region configured to enable the diode to operate as at least one of:
an avalanche diode; or
a single photon avalanche diode.

4. The diode of claim 1, wherein the third contact structure is located physically between the first contact structure and the second contact structure.

5. The diode of claim 1, wherein the second contact structure is located physically between the first contact structure and the third contact structure.

6. The diode of claim 1, wherein
the first contact structure is configured to receive a first voltage such that the first PN junction is reverse biased above a breakdown voltage and the diode operates as an avalanche diode, and
the second contact structure is electrically coupled to a first avalanche diode readout output.

7. The diode of claim 6, wherein the third contact structure is configured to selectively receive a regulated voltage such that the second PN junction is reverse biased below the breakdown voltage.

8. The diode of claim 1, wherein the third contact structure is configured to be selectively coupled to a photodiode readout output.

9. The diode of claim 1, wherein the first type of conductivity is n-type conductivity, and the second type of conductivity is p-type conductivity.

10. A method, comprising:
forming a first doped structure having a first type of conductivity, the first doped structure forming at least part of an isolation structure for a diode;
forming a first contact structure in the first doped structure, the first contact structure having the first type of conductivity, the first contact structure forming one of a cathode or an anode of the diode;
forming a second doped structure having a second type of conductivity, the second doped structure forming a first PN junction with the first doped structure;
forming a second contact structure in the second doped structure, the second contact structure having the second type of conductivity, the second contact structure forming the other of the cathode or the anode of the diode; and
forming a third contact structure located in the second doped structure, the third contact having the first type of conductivity, the third contact structure forming a second PN junction with the second doped structure.

11. The method of claim 10, wherein forming the first doped structure includes:

forming well having the first type of conductivity, the well forming a peripheral well of the diode; and
forming an isolation structure having the first type of conductivity, the well and the isolation structure at least partially overlapping with each other.

12. The method of claim 10, further comprising:
electrically coupling the first contact structure to a first voltage to reverse bias the first PN junction above a breakdown voltage and to operate the diode as an avalanche diode; and
electrically coupling the second contact structure to a first avalanche diode readout output.

13. The method of claim 12, further comprising:
selectively coupling the third contact structure to a regulated voltage such that the second PN junction is reverse biased below the breakdown voltage.

14. The method of claim 10, further comprising:
selectively coupling the third contact structure to a photodiode readout output.

15. The method of claim 10, wherein the first type of conductivity is n-type conductivity and the second type of conductivity is p-type conductivity.

16. The diode of claim 1, wherein the second PN junction is configured to steer charge from the second doped structure and decrease a sensitivity of the diode.

17. The method of claim 10, wherein the second PN junction is configured to steer charge from the second doped structure and decrease a sensitivity of the diode.

18. A diode, comprising:
a first doped region having a first type of conductivity;
a first contact region positioned in the first doped region, the first contact region having the first type of conductivity, the first contact region being one of a cathode or an anode of the diode;
a second doped region having a second type of conductivity;
a second contact region positioned in the second doped region, the second contact region having the second type of conductivity, the second contact region being the other of the cathode or the anode of the diode; and
a third contact region positioned in the second doped region, the third contact region having the first type of conductivity.

19. The diode of claim 18 wherein the first contact region includes a first portion and a second portion, and the second contact region and the third contact region are positioned between the first portion and the second portion of the first contact region.

20. The diode of claim 18, further comprising:
an isolation structure having the first type of conductivity, the first doped region and the isolation structure partially overlapping with each other.

* * * * *